United States Patent
Iwazaki et al.

(10) Patent No.: US 10,594,204 B2
(45) Date of Patent: Mar. 17, 2020

(54) CIRCUIT BOARD, ACTIVE FILTER DEVICE, AND AIR CONDITIONER

(71) Applicant: Mitsubishi Electric Corporation, Tokyo (JP)

(72) Inventors: Kenji Iwazaki, Tokyo (JP); Yosuke Shinomoto, Tokyo (JP); Kazunori Hatakeyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 38 days.

(21) Appl. No.: 15/766,027

(22) PCT Filed: Dec. 28, 2015

(86) PCT No.: PCT/JP2015/086552
§ 371 (c)(1),
(2) Date: Apr. 5, 2018

(87) PCT Pub. No.: WO2017/115431
PCT Pub. Date: Jul. 6, 2017

(65) Prior Publication Data
US 2018/0301979 A1    Oct. 18, 2018

(51) Int. Cl.
*H02P 29/50* (2016.01)
*H02M 1/12* (2006.01)
(Continued)

(52) U.S. Cl.
CPC .............. *H02M 1/12* (2013.01); *H02J 3/01* (2013.01); *H02M 5/458* (2013.01); *H02M 7/003* (2013.01);
(Continued)

(58) Field of Classification Search
USPC .......................................................... 361/748
See application file for complete search history.

(56) References Cited

U.S. PATENT DOCUMENTS

2008/0235939 A1* 10/2008 Hiew .................... H01L 21/561
29/831
2009/0250246 A1* 10/2009 Yaung .................. H05K 1/0266
174/250
(Continued)

FOREIGN PATENT DOCUMENTS

JP      H05-146154 A    6/1993
JP      10-247559 A     9/1998
(Continued)

OTHER PUBLICATIONS

Office action dated Feb. 5, 2019 issued in corresponding Japanese patent application No. 2017-558826 (and English translation).
(Continued)

*Primary Examiner* — Andargie M Aychillhum
(74) *Attorney, Agent, or Firm* — Posz Law Group, PLC (57) ABSTRACT

A circuit board accommodates a plurality of different source voltages. On the circuit board, a printed wire which constitutes a circuit is formed, a first circuit component used for a board which meets specifications for a first voltage or a second circuit component used for a board which meets specifications for a second voltage higher than the first voltage, is mounted, and spacing between adjacent printed wires is equal to or larger than a distance which secures an insulation distance when the second voltage is input.

16 Claims, 9 Drawing Sheets

(51) Int. Cl.

| | | |
|---|---|---|
| *H02J 3/01* | (2006.01) | |
| *H02M 7/00* | (2006.01) | |
| *H05K 1/02* | (2006.01) | |
| *H02M 5/458* | (2006.01) | |
| *H02P 27/08* | (2006.01) | |
| *H05K 1/11* | (2006.01) | |
| *H05K 1/18* | (2006.01) | |

(52) U.S. Cl.
CPC ............ *H02P 27/085* (2013.01); *H02P 29/50* (2016.02); *H05K 1/0254* (2013.01); *H05K 1/115* (2013.01); *H05K 1/181* (2013.01); *H05K 2201/09227* (2013.01); *H05K 2201/1006* (2013.01); *H05K 2201/10189* (2013.01)

(56) References Cited

U.S. PATENT DOCUMENTS

| | | |
|---|---|---|
| 2012/0063187 A1 | 3/2012 | Sato et al. |
| 2016/0248333 A1 | 8/2016 | Nakazawa et al. |

FOREIGN PATENT DOCUMENTS

| | | |
|---|---|---|
| JP | H10-341532 A | 12/1998 |
| JP | 2000-260532 A | 9/2000 |
| JP | 2001-260475 A | 9/2001 |
| JP | 2004-342997 A | 12/2004 |
| JP | 2004-349464 A | 12/2004 |
| JP | 2009-89469 A | 4/2009 |
| JP | 2009-146962 A | 7/2009 |
| JP | 2011-166299 A | 8/2011 |
| JP | 2012-065431 A | 3/2012 |
| JP | 2012-143094 A | 7/2012 |
| JP | 2015-162998 A | 9/2015 |
| WO | 2015/053141 A1 | 3/2017 |

OTHER PUBLICATIONS

International Search Report of the International Searching Authority dated Feb. 16, 2016 for the corresponding international application No. PCT/JP2015/086552 (and English translation).

Office Action dated Sep. 24, 2019 issued in corresponding JP patent application No. 2017-558826 (and English translation).

\* cited by examiner

CIRCUIT BOARD, ACTIVE FILTER DEVICE, AND AIR CONDITIONER

CROSS REFERENCE TO RELATED APPLICATION

This application is a U.S. national stage application of International Patent Application No. PCT/JP2015/086552 filed on Dec. 28, 2015, the disclosure of which is incorporated herein by reference.

TECHNICAL FIELD

The present invention relates to a circuit board applicable to an active filter device or the like which suppresses a harmonic current flowing from a power conversion device to a power source, an active filter device, and an air conditioner.

BACKGROUND

An active filter device is connected in parallel to a load such as a power conversion device which generates a harmonic current, and suppresses the harmonic current flowing from the load to a power source (Patent Literature 1). As described in Patent Literature 1, the active filter device includes an inverter unit and a control unit which controls the inverter unit, and the control unit controls the inverter unit so that the inverter unit generates a harmonic current having a phase opposite to the harmonic current generated by the load.

PATENT LITERATURE

Patent Literature 1: Japanese Patent Application Laid-open No. H10-341532

In a conventional active filter device such as that described in Patent Literature 1, a circuit board is designed to accommodate a specific source voltage. Therefore, in order to accommodate different source voltages, it is necessary to redesign the entire circuit board of the inverter unit including a wiring pattern. In addition, with regard to the control unit, parameters to be used in the control of the inverter unit must be redesigned to optimum values, and a load and cost for the redesign are required.

SUMMARY

The present invention has been made in view of the above, and an object thereof is to obtain a circuit board which achieves a plurality of types of active filter devices having different electrical characteristics at low cost.

In order to solve the above-described problems and achieve the object, a circuit board according to the present invention accommodates a plurality of different source voltages. In the circuit board, a printed wire which constitutes a circuit is formed, a first circuit component used for a board which meets specifications for a first voltage or a second circuit component used for a board which meets specifications for a second voltage higher than the first voltage, is mounted, and spacing between adjacent printed wires is equal to or larger than a distance which secures an insulation distance when the second voltage is input.

The present invention achieves an effect of obtaining a circuit board which can achieve a plurality of types of active filter devices having different electrical characteristics at low cost.

DETAILED DESCRIPTION

Hereinafter, a circuit board, an active filter device, and an air conditioner according to each embodiment of the present invention will be described in detail with reference to the drawings. The invention is not limited to the embodiments.

First Embodiment

Figure 1:
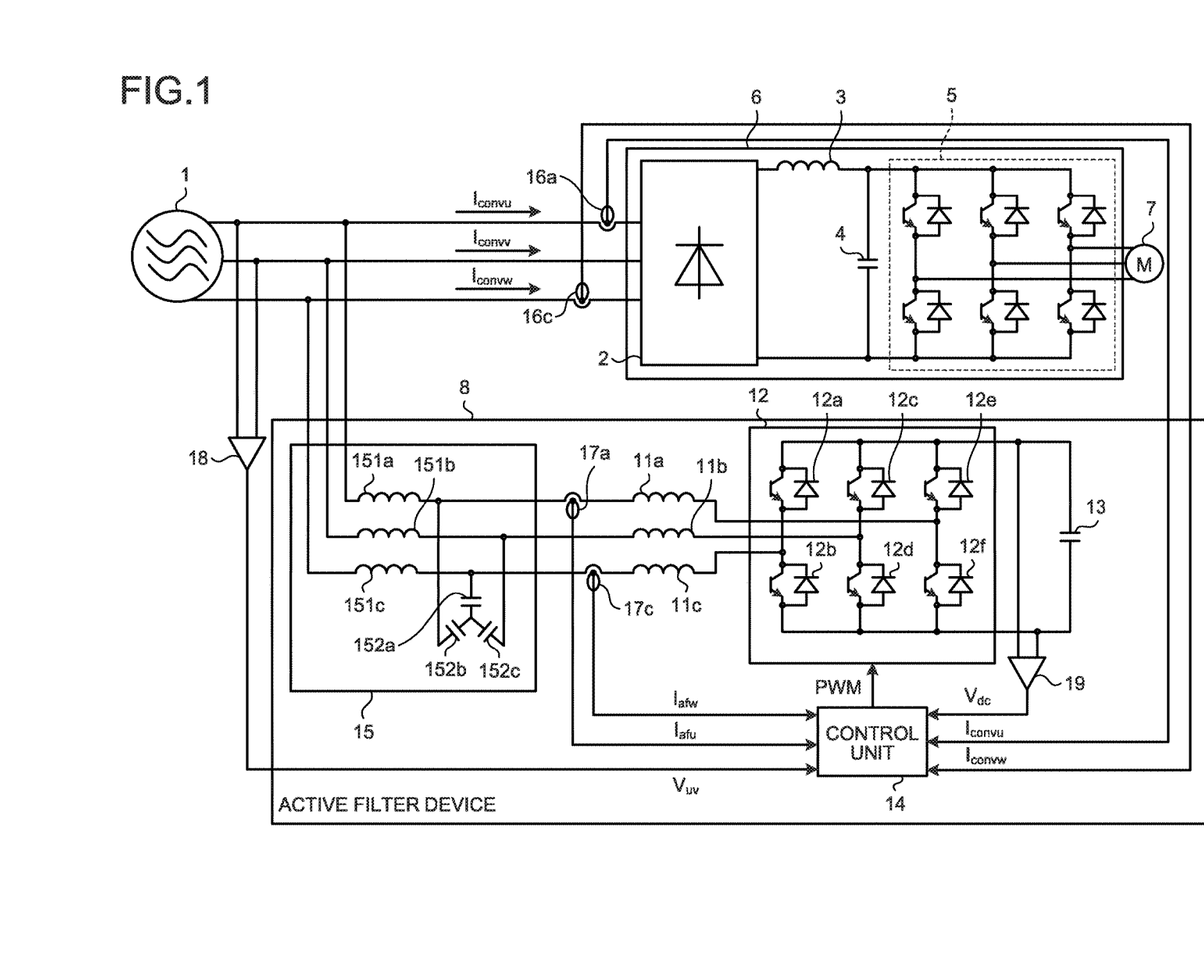
FIG. 1 is a diagram illustrating an example of a configuration and application of an active filter device according to a first embodiment.

FIG. 1 is a diagram illustrating an example of a configuration and application of an active filter device according to a first embodiment of the present invention. FIG. 1 illustrates the example of application of the active filter device in a case of suppressing a harmonic current generated by a power conversion device. As the power conversion device 6, an inverter used in an air conditioner, a freezer, or the like, is conceived, but there is no limitation thereto.

As illustrated in FIG. 1, the active filter device 8 according to the present embodiment is connected in parallel to the power conversion device 6 which converts power supplied from an alternating-current source 1 to generate power for driving a motor 7, and compensates for the harmonic current generated by the power conversion device 6.

The power conversion device 6 is constituted by diodes and is configured to include a rectifier 2, a direct-current reactor 3, a smoothing capacitor 4, and an inverter 5. The rectifier 2 rectifies and converts three-phase alternating-current power generated by the alternating-current source 1 into direct-current power. The direct-current reactor 3 is connected to an output side of the rectifier 2. The smoothing capacitor 4 smooths an output voltage from the rectifier 2. The inverter 5 converts the direct-current power smoothed by the smoothing capacitor 4 into alternating-current power for driving the motor 7. The power conversion device 6 and the motor 7 are devices which consume electric power supplied from the alternating-current source 1, that is, loads.

The active filter device 8 includes alternating-current reactors 11a, 11b and 11c, a power conversion unit 12, a capacitor 13, a control unit 14, and a ripple filter 15. The alternating-current reactors 11a, 11b and 11c suppress harmonic current generated by the power conversion device 6. The power conversion unit 12 is constituted by switching elements 12a, 12b, 12c, 12d, 12e and 12f, and generates a current having a phase opposite to the harmonic current generated by the power conversion device 6 by adjusting voltages generated by the alternating-current reactors 11a to 11c. The capacitor 13 is a capacitive component which is connected to a direct-current terminal side of the power conversion unit 12, and smooths a bus voltage in the power conversion unit 12 to keep the bus voltage at a constant value. The control unit 14 controls the switching elements 12a to 12f of the power conversion unit 12. The ripple filter 15 suppresses ripple components generated in the switching elements 12a to 12f of the power conversion unit 12.

In addition, the active filter device 8 includes a current detector 16a, a current detector 16c, a current detector 17a, a current detector 17c, a voltage detector 18, and a voltage detector 19. The current detectors 16a and 16c detect a U-phase current and a W-phase current, respectively, among the three-phase alternating-currents flowing from the alternating-current source 1 to the power conversion device 6. The current detectors 17a and 17c detect a U-phase current and a W-phase current, respectively, among the three-phase alternating-currents flowing from the power conversion unit 12 to the ripple filter 15. The voltage detector 18 detects a line voltage between the U-phase and the V-phase output from the alternating-current source 1. The voltage detector 19 is connected to the direct-current terminal side of the power conversion unit 12 and detects a voltage across the capacitor 13.

The control unit 14 receives input of current detection values $I_{convu}$, $I_{convw}$, $I_{afu}$, and $I_{afw}$ detected by the current detectors 16a, 16c, 17a, and 17c, respectively, the line voltage between the U-phase and V-phase detected by the voltage detector 18, and the voltage $V_{dc}$ across the capacitor 13 detected by the voltage detector 19, and performs Pulse Width Modulation (PWM) control of the switching elements 12a to 12f based on the current detection values $I_{convu}$, $I_{convw}$, $I_{afu}$, and $I_{afw}$, the line voltage $V_{uv}$ between the U-phase and the V-phase, and the voltage $V_{dc}$ across the capacitor 13 thus input.

The control unit 14 can always know the voltage detected by the voltage detector 18. Accordingly, the control unit 14 can switch circuit parameters so that the active filter device 8 can perform an optimum operation depending on the voltage detection value by the voltage detector 18. For example, with respect to a plurality of voltage values which can be detected by the voltage detector 18, the control unit 14 holds a plurality of types of circuit parameters corresponding to the voltage values as a table. When receiving a voltage detection value from the voltage detector 18, the control unit 14 selects a circuit parameter corresponding to the received voltage detection value from the table, and performs an operation in accordance with the selected circuit parameter.

The circuit parameters are parameters used in the switching control of the power conversion unit 12, and are held in a storage circuit such as a memory. The storage circuit may be provided inside the control unit 14 or may be provided outside the control unit 14. A plurality of parameters held as a table is obtained in advance by simulation or the like. Consequently, even when the active filter device 8 is used in a region where fluctuation of a source voltage is large or the like, it is possible to operate the active filter device 8 while performing switching to an appropriate parameter depending on the fluctuation of the source voltage to be input, and a capability to suppress a harmonic current can be maintained. The source voltage is a voltage supplied from the alternating-current source 1.

The ripple filter 15 is configured to include reactors 151a, 151b and 151c connected in series to the alternating-current reactors 11a to 11c and capacitors 152a, 152b and 152c for three phases connected in parallel to the alternating-current reactors 11a to 11c. The capacitors 152a to 152c are first capacitive components. Although FIG. 1 illustrates an example in which the capacitors 152a to 152c are Y-connection, the capacitors 152a to 152c may be Δ-connection.

The ripple filter 15 is not indispensable for the active filter device 8, but is desirably included therein. Since the active filter device 8 is applied for the purpose of suppressing the harmonic current and bringing a current waveform close to a sine wave, it is desirable for the active filter device 8 to include the ripple filter 15, and to remove, by the ripple filter 15, a ripple component which is included in a current to be generated and partially contributes to distortions of the waveform.

Figure 2:
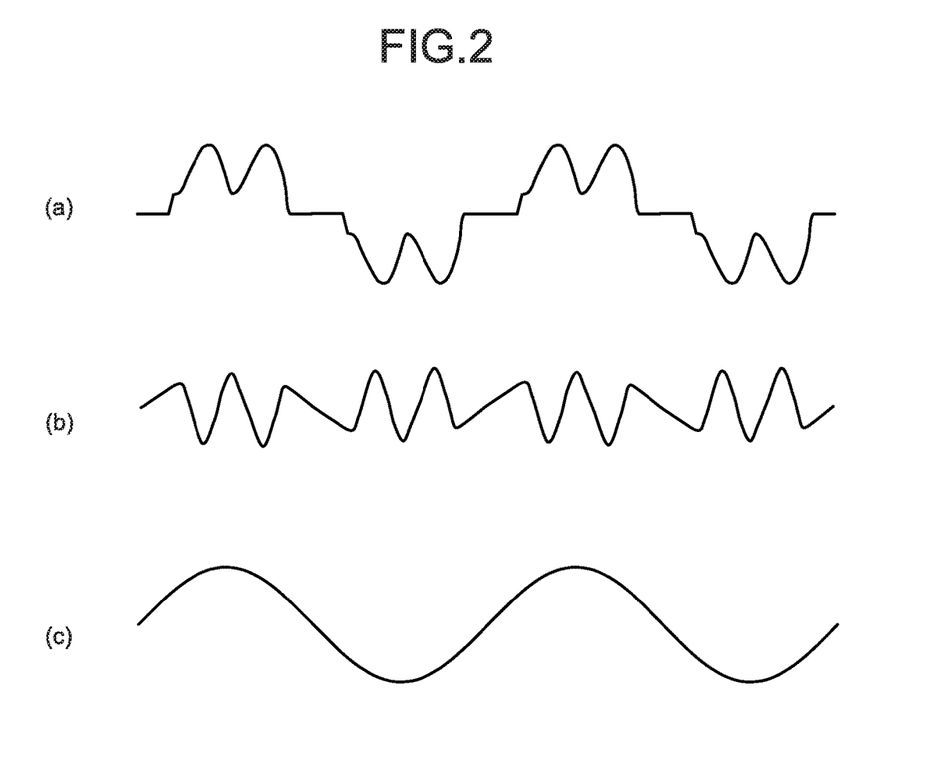
FIG. 2 is a diagram illustrating an example of a current flowing in a load connected to an alternating-current source.

Here, it is generally known that a load current including a harmonic current such as that illustrated in FIG. 2(a) flows in the power conversion device 6. That is, the load current flowing through the power conversion device 6 includes a harmonic current which is a harmonic component. Therefore, in the active filter device 8, the control unit 14 performs switching control of the switching elements 12a to 12f of the power conversion unit 12 to control a terminal voltage of the power conversion unit 12, thereby adjusting voltages generated in the alternating-current reactors 11a to 11c, and an active filter current which suppresses the harmonic current included in the load current illustrated in FIG. 2(b) flows.

Consequently, a desired current flows from the active filter device 8 to the alternating-current source 1 side, the harmonic current generated by the power conversion device 6 connected to the alternating-current source 1 is suppressed, and a system current such as that illustrated in FIG. 2(c), which is a sine wave current without distortion, flows in the alternating-current source 1. However, due to a switching operation of the power conversion unit 12, the ripple component is added to the current. In order to remove the ripple component, the active filter device 8 includes the ripple filter 15.

An operation performed when the active filter device 8 conducts an active filter current such as that illustrated in FIG. 2(b), that is, a control operation by the control unit 14 of the active filter device 8, is a well-known technique, and therefore, a detailed description of the control operation will be omitted. The active filter device 8 is a device which suppresses the harmonic current generated from the power conversion device 6 and performs control so that a current having a waveform close to a sine waveform flows out from the alternating-current source 1.

In FIG. 1, the current detectors 16a and 16c are configured separately from the active filter device 8, but the current detectors 16a and 16c may be included inside the active filter device 8.

In addition, a part or all of the switching elements 12a to 12f may be formed of a wide bandgap semiconductor such as Silicon Carbide (SiC). Since switching elements formed of the wide bandgap semiconductor have high withstand voltage and allowable current density, the switching elements can be miniaturized. Use of the miniaturized switching elements makes it possible to miniaturize a semiconductor module into which the miniaturized switching elements are incorporated.

In addition, since the switching elements formed of the wide bandgap semiconductor have high heat resistance, a heat-dissipating fin of a heat sink can be miniaturized, and therefore, the semiconductor module can be further miniaturized. Furthermore, since power loss of the switching elements formed of the wide bandgap semiconductor is low, the efficiency of the semiconductor module can be improved.

Figure 3:
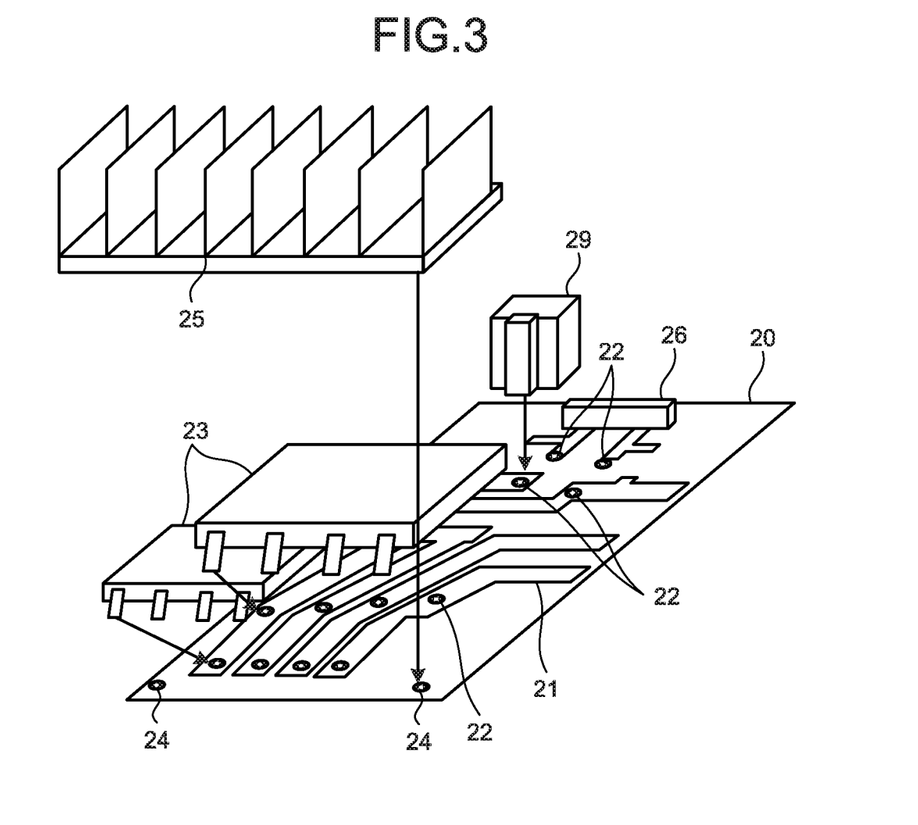
FIG. 3 is a diagram illustrating an example of a circuit board included in the active filter device according to the first embodiment.

In the active filter device 8, the power conversion unit 12, the capacitor 13, and the control unit 14 are mounted on a circuit board 20 illustrated in FIG. 3. The active filter device 8 according to the present embodiment is characterized by the circuit board 20 on which each circuit element constituting the circuit is mounted. The circuit board 20 is configured to be capable of selectively connecting components of the same type having different electrical characteristics to a specific position in the circuit so as to be able to accommodate a plurality of types of loads having different source voltages.

Any one or more of the current detector 17a, the current detector 17c, the voltage detector 18, and the voltage detector 19 may be mounted on the circuit board 20.

FIG. 3 is a diagram illustrating an example of the circuit board 20 included in the active filter device 8. The circuit board 20 includes a substrate, a plurality of printed wires 21, a plurality of through holes 22, a circuit component 23, a heat-dissipating fin 25, a circuit component 26, and a circuit component 29. The substrate is made of an insulating resin or the like. The printed wires 21 are printed wiring patterns formed on the substrate and constituting a circuit. The through holes 22 are holes formed in the printed wires 21 through the substrate. The circuit component 23 achieves the power conversion unit 12. The heat-dissipating fin 25 is mounted into a mounting hole 24 formed in the substrate and dissipates heat generated by the circuit component 23. The circuit component 26 has a control power source (illustration thereof is omitted) therein and constitutes the control unit 14. The circuit component 29 is a transformer component.

Each of the circuit component 23, the circuit component 26, and the circuit component 29 has a plurality of terminals. The terminals are inserted into the through holes 22, and are connected to the printed wires 21 by soldering or the like, and thereby each of the circuit component 23, the circuit component 26, and the circuit component 29 is electrically connected to the printed wires 21.

When the circuit board 20 is made to accommodate a plurality of different source voltages, it is sometimes necessary to use, as circuit components to be mounted on the circuit board 20, circuit components which are different in electrical characteristics such as withstand voltage, wattage, and allowable current amount.

In general, the cross-sectional area of a printed wire (hereinafter referred to as a pattern cross-sectional area) and spacing between adjacent printed wires (hereinafter referred to as pattern spacing) depend on an amount of a current flowing through each printed wire and a voltage applied thereto. For example, when a high voltage of 400 V is input to a circuit board of 200 V specification, the pattern spacing is small with respect to the input voltage. Accordingly, there is a risk that an insulation distance cannot be secured and the circuit is short-circuited and destroyed. Thus, when there is a need to increase the voltage to be applied, it is necessary to widen the spacing between adjacent patterns.

Therefore, in the circuit board 20 included in the active filter device 8, the pattern spacing between portions in the printed wires 21 provided on the circuit board 20 where the voltage to be applied changes with a change in an input voltage is set to be equal to or larger than a minimum insulation distance when a maximum voltage is input from the alternating-current source 1, considering a maximum value of a voltage which can be input from the alternating-current source 1.

Specifically, when a high voltage of 400 V, which is the maximum voltage input to a general active filter device, is input, there is a risk that a peak value may be 500 V or more, and a distance of 3.8 mm or more is secured for the pattern spacing of the printed wires 21 so that an insulating distance conforming to the international standard, which is 3.8 mm, is secured at a minimum.

Here, the input voltage means a voltage to be input from the alternating-current source 1 to the active filter device 8, and the voltage to be applied means a voltage to be applied to an arbitrary position of the printed wiring pattern. Wires between a power input terminal to which the alternating-current source 1 is connected and the power conversion unit 12, or the like correspond to the printed wires in a portion where the voltage to be applied changes with a change in the input voltage.

When a low voltage of 200 V is input to a circuit board of 400 V specification while maintaining identical power, a current flowing in the wiring pattern is higher in low voltage specifications in comparison between high voltage specifications and low voltage specifications, and therefore heat is generated. When the current exceeds the allowable current amount, there is a risk that the circuit does not operate properly due to heat generation. Thus, when there is a need to conduct a large amount of current, it is necessary to increase the cross-sectional area of the pattern.

Therefore, in the circuit board 20 included in the active filter device 8 of the present invention, since the allowable current amount generally increases when the pattern cross-sectional area of the wire is increased, the pattern cross-sectional area of a portion where the voltage to be applied changes with a change in the input voltage is set to be equal to or larger than an area which can accept a current on a side of low voltage specifications, that is, a maximum current which can be carried in the printed wire 21.

Specifically, when a low voltage of 200 V, which is a general voltage value used in Japan, is input, there is a risk that a current of 70 A will flow instantaneously. Thus, a cross sectional area of 2.45 mm^2 or more is secured for the pattern cross-sectional area of the printed wire 21 so that a cross sectional area conforming to the international standard, which is 2.45 mm^2, is secured at a minimum.

As described above, in the circuit board 20 included in the active filter device 8 of the present invention, the pattern spacing of the printed wires 21 is set to be equal to or larger than the minimum insulation distance when the maximum voltage is input from the alternating-current source 1, and the pattern cross-sectional area of the printed wire 21 is set to be equal to or larger than a minimum allowable width which can accept a maximum current which can be carried in the printed wire 21, and thereby the insulation distances between the wiring patterns can be ensured for both the case of low voltage specifications and the case of high voltage specifications, and the current flowing in each wire can be kept within an allowable range. Therefore, the circuit board 20 can receive input of different source voltages without changing the wiring patterns.

When circuit components of which electrical characteristics such as withstand voltage, wattage, and allowable current amount are different are used as circuit components to be mounted on the circuit board 20 in order to make the circuit board 20 accommodate a plurality of different source voltages, the sizes, that is, the external dimensions of the circuit components may be different depending on differences in the electrical characteristics.

Figure 4:
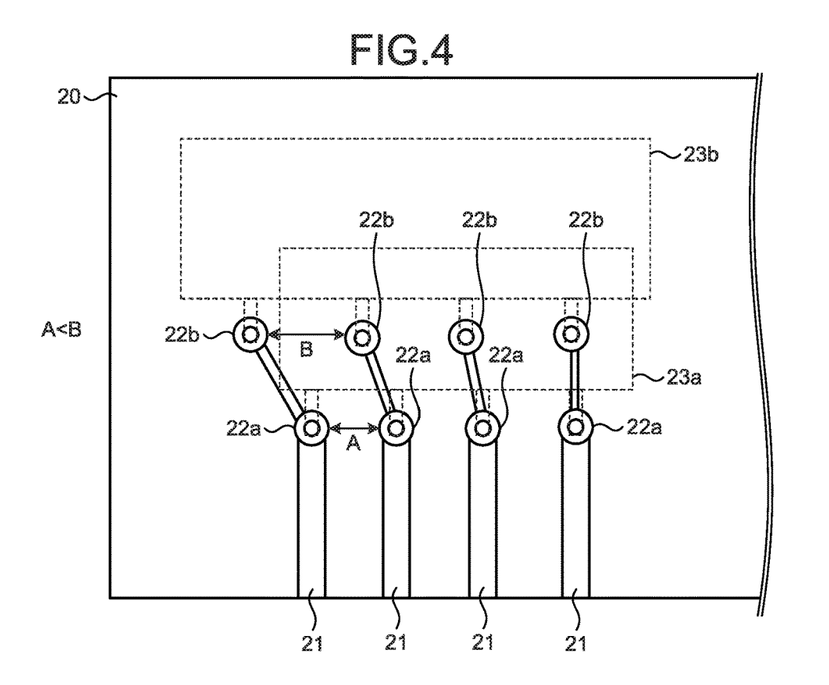
FIG. 4 is a diagram illustrating an example of a wiring pattern formed on the circuit board according to the first embodiment.

Therefore, in the circuit board 20 included in the active filter device 8 of the present invention, as illustrated in FIG. 4, the printed wires 21 are formed in four rows in parallel on the substrate, and as the through hole 22, one through hole 22a and one through holes 22b are provided in each of the four printed wires 21. The four through holes 22a and the four through holes 22b are provided in parallel and are arranged such that spacing A between the through holes 22a formed in the adjacent printed wires 21 is smaller than spacing B between the through holes 22b formed in the adjacent printed wires 21.

The circuit component 23 is an electronic component which constitutes the power conversion unit 12 and has four terminals aligned in parallel. A circuit component 23a, which has a small external dimension and a short distance between terminals, is mounted by inserting four terminals into the through holes 22a and then performing soldering. A circuit component 23b, which has a larger external dimension and a longer distance between terminals than the circuit component 23a, is mounted by inserting four terminals into the through holes 22b and then performing soldering. That is, since the circuit board 20 includes a plurality of sets of the through holes 22 arranged in different spacing conditions, it is possible to selectively attach the circuit components 23a and 23b, spacing between the terminals of the circuit component 23a being different from that of the circuit component 23b, to accommodate a plurality of different source voltages.

In the example indicated in the present embodiment, the number of through holes 22a is the same as the number of through holes 22b, and in FIG. 4, distances between each of four pairs of through holes 22a and 22b are the same, that is, a line formed by the four through holes 22a and a line formed by the four through holes 22b are parallel, but there is no limitation thereto. Although the number of terminals of the circuit component 23 is four in the indicated example, the number of terminals may be any other number than four.

It is only necessary to have, in addition to through holes to be applied to a circuit component which accommodates one source voltage, through holes to be applied to a circuit component which accommodates a different source voltage. One or more through holes 22 may be shared by the through holes 22a and the through holes 22b, the through holes 22a and the through holes 22b may be aligned in a row, or the through holes 22a and the through holes 22b may be arranged in different angles with respect to the shared through hole 22. By sharing through holes, the area of the circuit board 20 can be reduced to reduce the cost.

Alternatively, in the circuit board 20, for at least two or more types of circuit components, through holes for mounting circuit components are formed into a shape with which circuit components of different sizes can be selectively attached.

As described above, in the circuit board 20 included in the active filter device 8 of the present invention, in addition to through holes to be applied to a circuit component which accommodates one source voltage, through holes to be applied to a circuit component which accommodates a different source voltage are included, and consequently, the circuit component which accommodates a different source voltage can be mounted on the circuit board 20 without changing the wiring pattern.

When the circuit board 20 is made to accommodate a plurality of different source voltages, a transformer component which transforms a voltage to be input to a predetermined voltage may be required depending on the voltage to be input.

Figure 5:
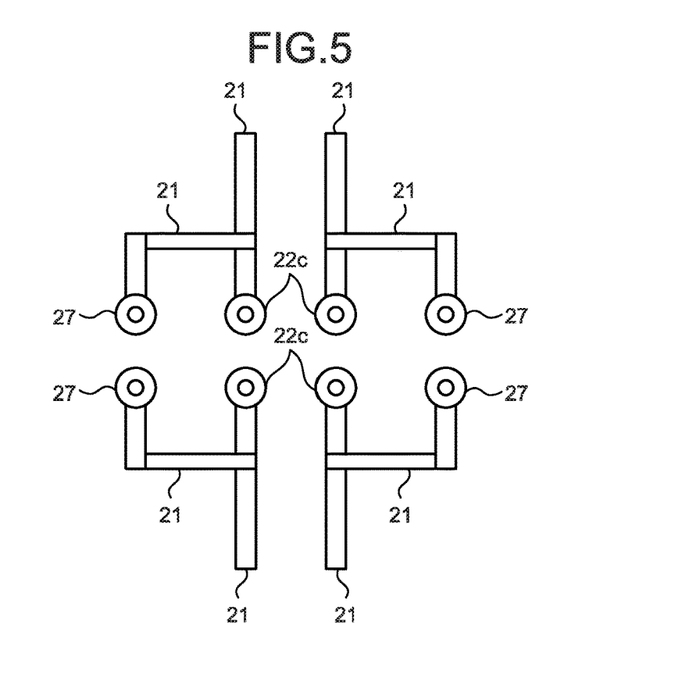
FIG. 5 is a diagram illustrating an example of a wiring pattern formed on the circuit board according to the first embodiment.

Therefore, in the circuit board 20 included in the active filter device 8 according to the present embodiment, in addition to the four printed wires 21 (see FIG. 4) in parallel to which the circuit component 23 is connected, the printed wires 21 having a shape illustrated in FIG. 5, are formed. Specifically, the printed wires 21 have a shape in which each of two printed wires 21 having different polarities is divided, and each of end portions of the four printed wires 21 thus divided is further bifurcated into two portions. A through hole 22c is provided at one end portion of each printed wire 21 bifurcated into two portions and a jumper connecting unit 27 to which a jumper 28 is connected is provided at the other end portion of each end portion bifurcated into two portions. The end portions of the printed wires 21 having the through holes 22c are formed to face each other and the end portions of the printed wires 21 having the jumper connecting units 27 are formed to face each other. The circuit component 29 which is a transformer component is connected to the through holes 22c, and the jumpers 28 are connected to the jumper connecting units 27.

Figure 6:
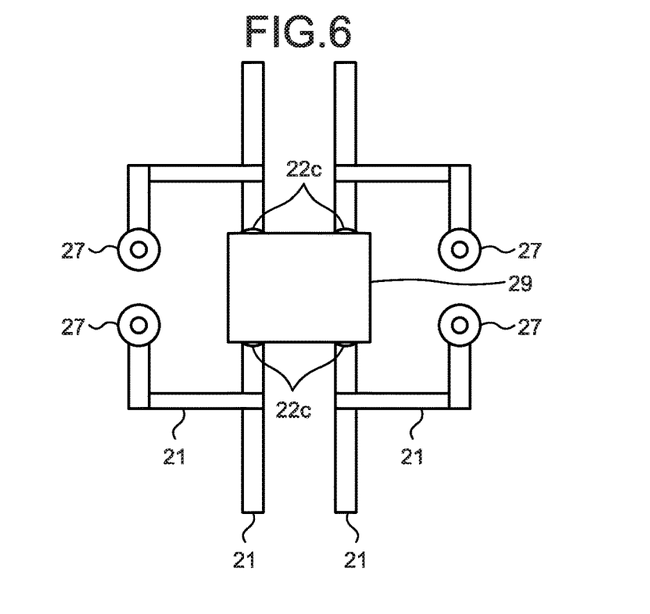
FIG. 6 is a diagram illustrating an example of a case where a circuit component is attached to the circuit board according to the first embodiment.

For example, as illustrated in FIG. 6, when a specified value of an input voltage of a control power source circuit is adjusted to meet low voltage specifications and a voltage of high voltage specifications is input to the circuit board 20, the circuit component 29 which is a transformer component is mounted into the through holes 22c of the printed wires 21, and the source voltage is stepped down to a voltage of low voltage specifications to be a value which can be input to the control power source circuit of low voltage specifications.

Figure 7:
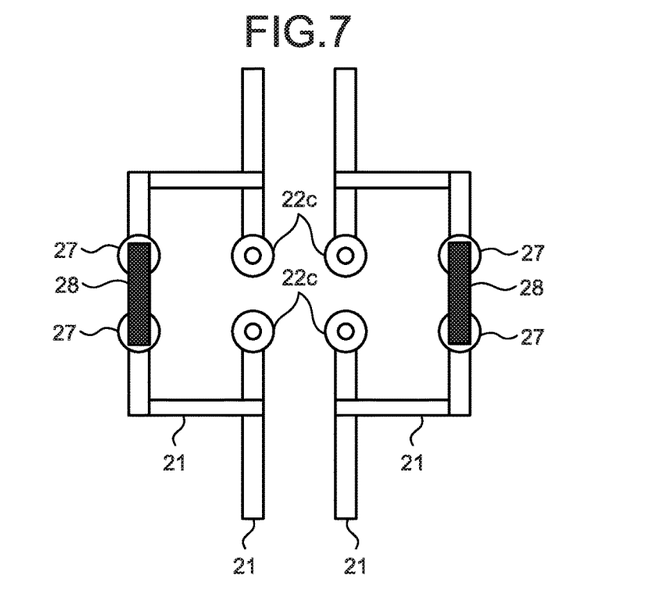
FIG. 7 is a diagram illustrating an example of a case where a jumper is attached to the circuit board according to the first embodiment.

Since it suffices to input the source voltage as it is to the control power source circuit when a voltage of low voltage specifications is input to the circuit board 20, as illustrated in FIG. 7, the circuit component 29 is not mounted into the through holes 22c of the printed wires 21, the jumpers 28 are attached to the jumper connecting units 27, and the two sets of printed wires 21 facing each other are electrically connected, and thereby the source voltage is input without being transformed.

As described above, in the circuit board 20 included in the active filter device 8 according to the present embodiment, the voltage to be input to the control power source circuit of the circuit component 26 can be made constant by providing the jumper connecting units 27 in addition to the through holes 22c, and different source voltages can be input without changing the wiring pattern.

When the circuit board 20 is made to accommodate a plurality of different source voltages, an amount of heat dissipation necessary for heat dissipation of the power conversion unit 12 may be different depending on the voltage to be input.

Therefore, the heat-dissipating fins 25 of high voltage specifications and low voltage specifications are shaped to have different heat-dissipating capabilities, and are designed to be attached to the same place on the circuit board 20. For example, a bottom-surface shape of a heat-dissipating fin which accommodates high voltage specifications and a bottom-surface shape of a heat-dissipating fin which accommodates low voltage specifications are designed to be the same, and the height of the heat-dissipating fin 25 which accommodates low voltage specifications is changed to be higher than the height of the heat-dissipating fin 25 which accommodates high voltage specifications, thereby changing the heat-dissipating capability.

As described above, in the circuit board 20 included in the active filter device 8 according to the present embodiment, since either of the heat-dissipating fin 25 of high voltage specifications or the heat-dissipating fin 25 of low voltage specifications can be mounted into the mounting hole 24 for mounting the heat-dissipating fin 25 without changing the board itself, it is possible to accommodate different voltage specifications without changing the board itself.

The further the amount of heat generation increases, the further the height of the heat-dissipating fin 25 increases. Therefore, regarding a housing of the active filter device 8, a size large enough for housing the heat-dissipating fin 25 at maximum heat generation is secured. Consequently, a common housing can be used even at different voltages, and an increase in cost can be suppressed.

When the circuit board 20 is made to accommodate a plurality of different source voltages, specifications required for the capacitor may be different depending on the voltage to be input.

For example, FIG. 1 illustrates an example in which the capacitors 152a to 152c are connected by Y-connection. However, in a case of Y-connection, the electrostatic capacity is ⅓ as much as that in a case of Δ-connection, and thus it is necessary to have a capacitor of which capacitance is three times larger than capacitance of a capacitor achieved by Δ-connection. In addition, since a voltage between terminals of the capacitors is 1/√3 of the line voltage, the withstand voltage can be lowered compared to the case of Δ-connection. On the other hand, when the capacitors 152a to 152c are connected by Δ-connection, the line voltage is applied as it is between the terminals of the capacitors, and a capacitor with high withstand voltage is required when setting the active filter device 8 to be of high voltage specifications.

Accordingly, it is desirable to give priority to improve withstand voltage and therefore to use Y-connection in a case of high voltage specifications, and it is desirable to give priority to secure capacitance and therefore to use Δ-connection in a case of low voltage specifications. However, in a general ripple filter, the connection is determined by the printed wires, and it is difficult to change the connection even in a case of trying to accommodate different voltage specifications.

Figure 8:
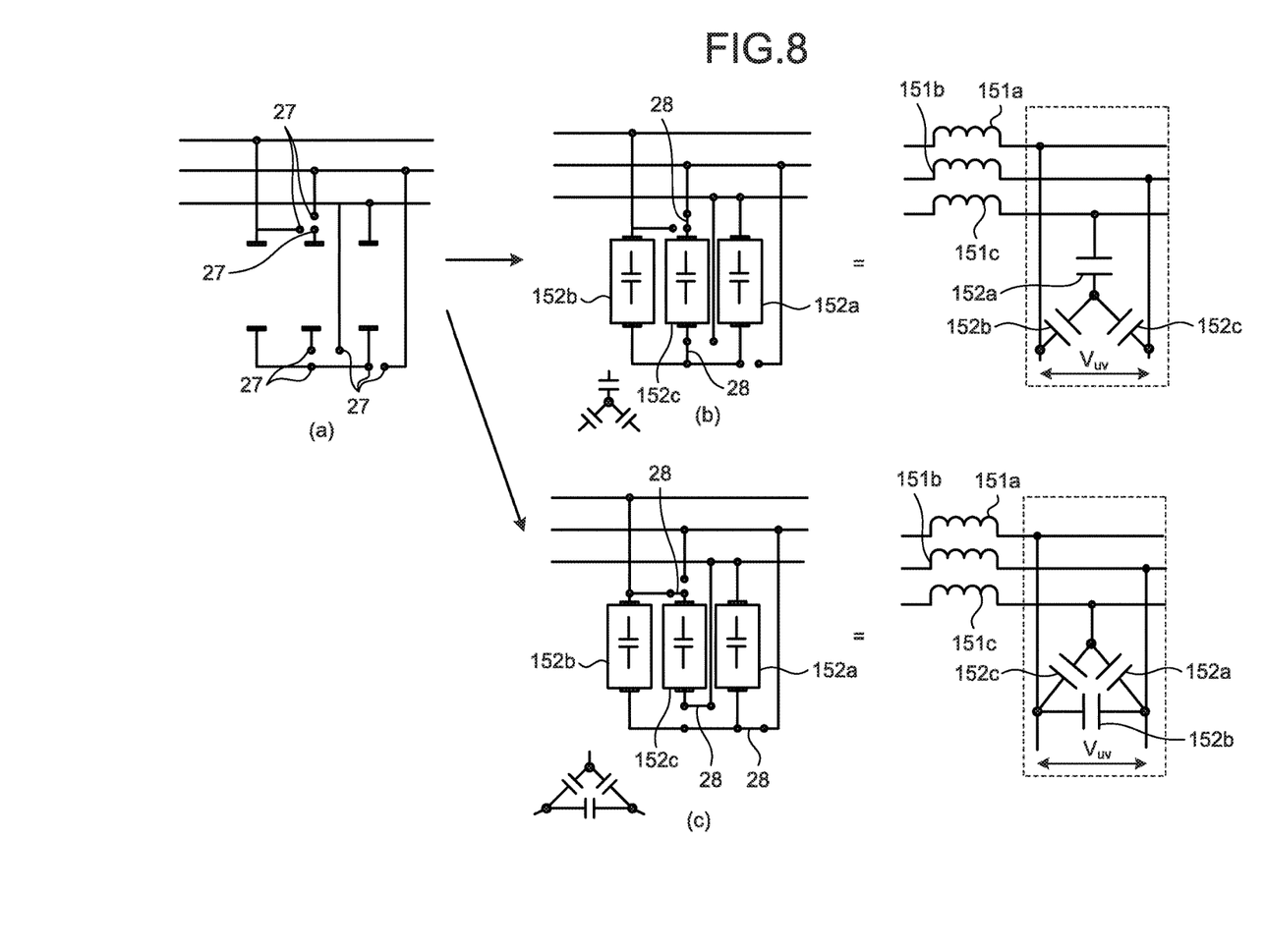
FIG. 8 is a diagram illustrating a configuration example of a ripple filter included in the active filter device according to the first embodiment.

Thus, on the circuit board 20 included in the active filter device 8 of the present invention, the jumper connecting units 27 are provided at end portions of the printed wires 21 to which the capacitors 152a to 152c are connected and the end portion of the printed wire 21 extending from each of the three phases, which are portions where the wires illustrated in FIG. 8(a) are disconnected, and the jumpers 28 are attached to the jumper connecting units 27 to rearrange the connections around the capacitors 152a to 152c, and thereby the Y-connection illustrated in FIG. 8(b) or the Δ-connection illustrated in FIG. 8(c) can be selected.

As described above, in the circuit board 20 included in the active filter device 8 of the present invention, by providing the jumper connecting units 27 on the printed wires 21 to which the capacitors 152a to 152c are connected, the active filter device 8 can accommodate a change of voltage specifications only by changing capacity of the capacitor and the connection method, and can operate as a plurality of types of active filters with different voltage specifications.

Figure 9:
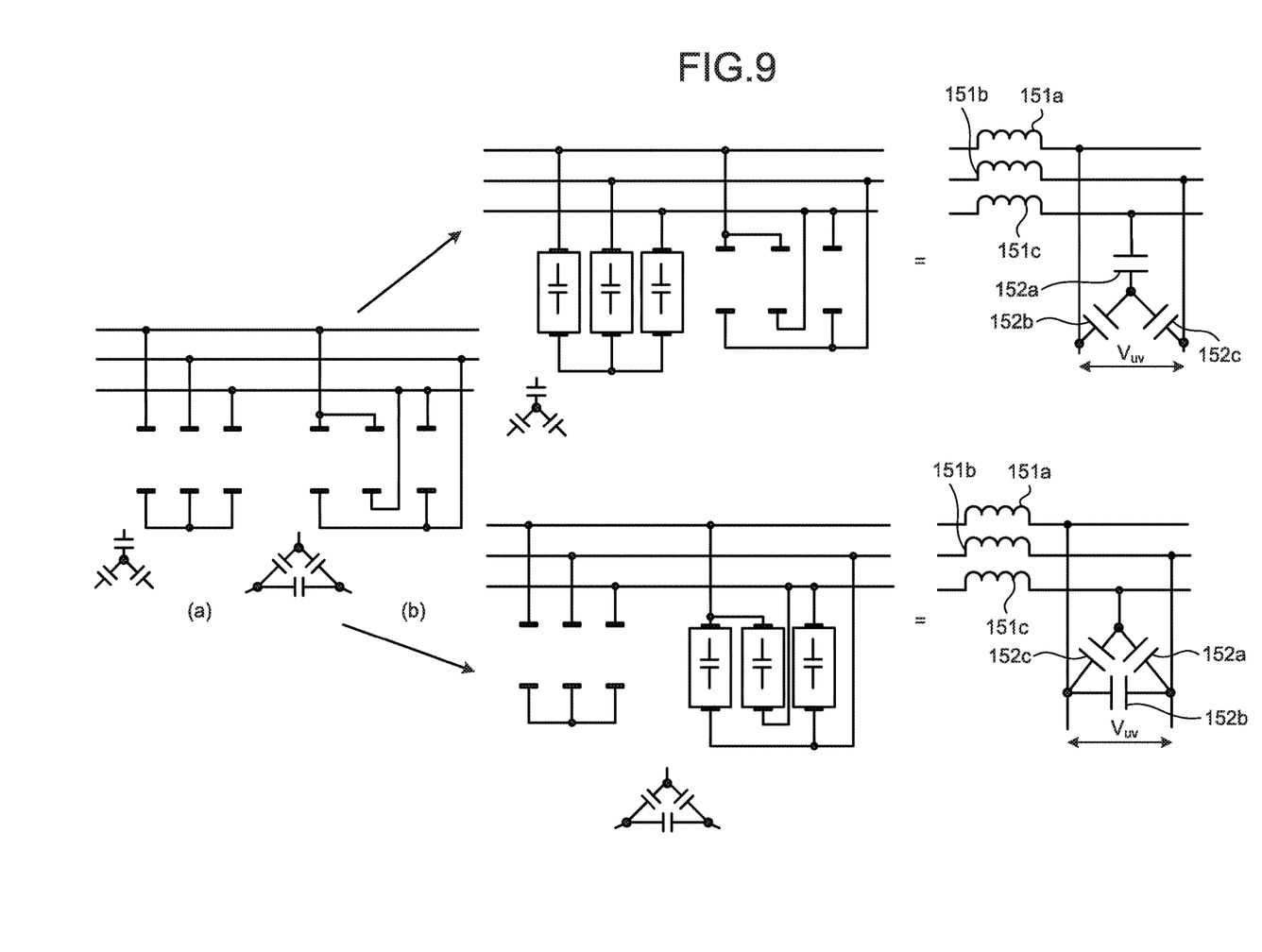
FIG. 9 is a diagram illustrating another configuration example of the ripple filter included in the active filter device according to the first embodiment.

The configuration illustrated in FIG. 8 is an example and there is no limitation to this configuration. The configuration which accommodates a change of voltage specifications by changing the capacity of the capacitor and the connection method is an example. As illustrated in (a) and (b) of FIG. 9, both wiring of Y-connection and wiring of Δ-connection may be configured in advance without performing switching by the jumper. Furthermore, a pattern configuration may be employed which is capable of accommodating a change of voltage specifications by, instead of changing the connection method, connecting multiple capacitors in series to enhance the withstand voltage, connecting multiple capacitors in parallel to enhance the capacity, or the like.

Second Embodiment

Next, the active filter device 8 according to a second embodiment will be described. In the present embodiment, the active filter device 8 will be described which is configured such that the area of the circuit board 20 is made smaller.

The basic configuration and operation of the active filter device 8 according to the present embodiment are similar to the basic configuration and operation of the active filter device 8 according to the first embodiment. Therefore, the same reference numerals are given to the same or equivalent component parts to component parts of the first embodiment, and descriptions thereof will be omitted. Further, a description of the operation will be omitted.

Figure 10:
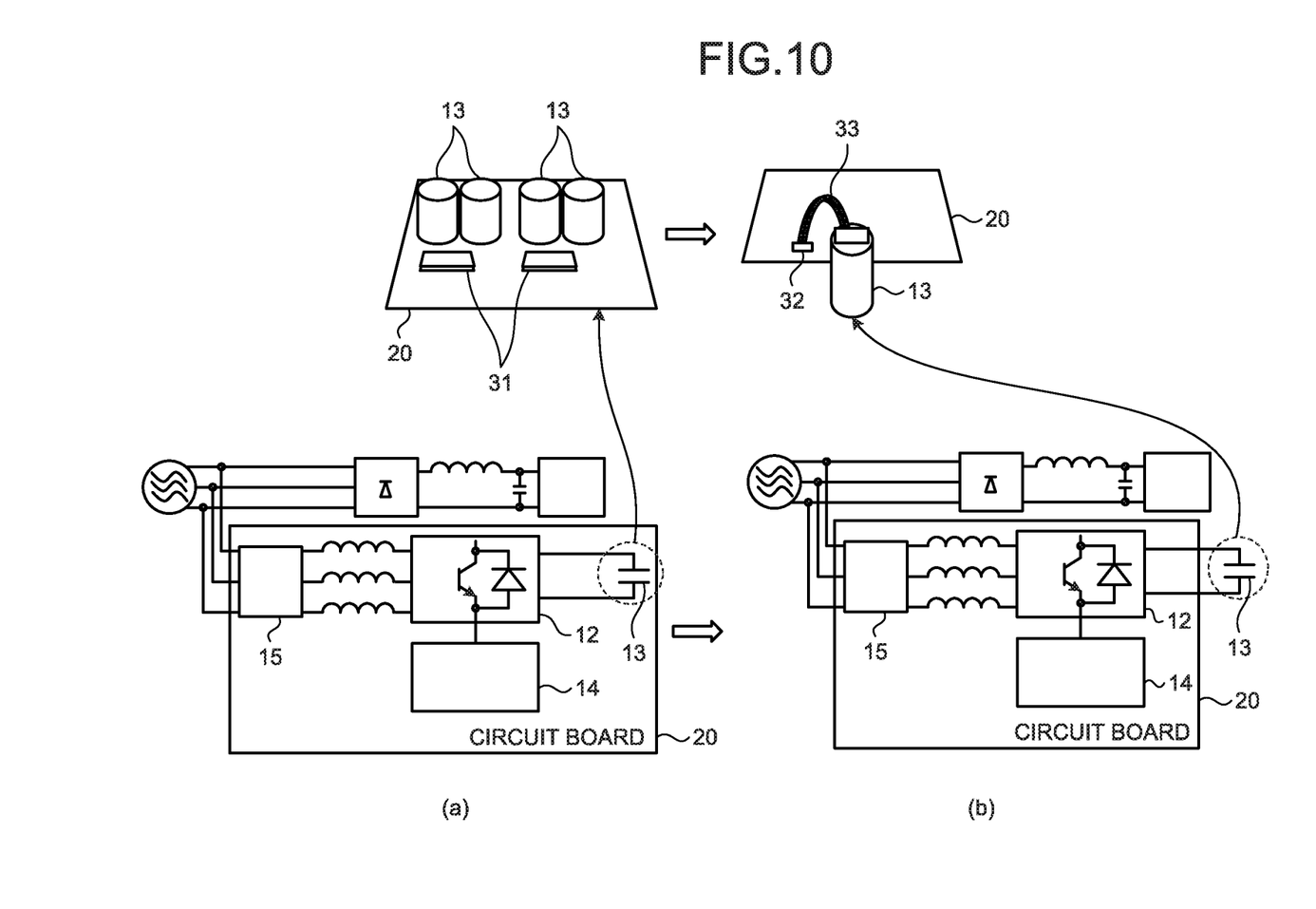
FIG. 10 is a diagram illustrating an example of connection between a circuit board and a capacitor included in an active filter device according to a second embodiment.

The power conversion unit 12 and the control unit 14 are mounted on the circuit board 20 of the active filter device 8 according to the second embodiment. The circuit board 20 includes a substrate (not illustrated), a plurality of printed wires 21, a plurality of through holes 22, the circuit component 23, the heat-dissipating fin 25, the circuit component 26, the circuit component 29, and a connector 32. The connector 32 is attached onto the printed wire 21 and is connected to the capacitor 13 which is a second capacitive component provided externally to the circuit board 20 by using a lead wire 33.

In the active filter device 8 according to each of the first and the second embodiments, since a bus voltage is at least twice as high as a phase voltage, a voltage exceeds 700 V in a case of high voltage specifications, and capacitors which can accommodate the voltage are limited. Therefore, it is necessary to mount the capacitor 13 with sufficient withstand voltage on the circuit board 20, or improve withstand voltage by connecting multiple capacitors 13 in series.

However, capacitive components with high withstand voltage generally have a large volume, and when such a capacitive component is mounted on the circuit board 20, the capacitive component occupies a large space in the board area and the board size may increase. As a result, mass production may become impossible depending on factory facilities. When the board is designed in accordance with an element having a large volume, an amount of extra space is increased when the board is changed to be of low voltage specifications, which generates waste.

On the other hand, in a case where multiple capacitors are connected in series to improve the withstand voltage, since capacitance is halved when two capacitive components are connected in series, for example, it is necessary to secure the capacitance by connecting two capacitors 13, which have been connected in series similarly thereto, in parallel (see FIG. 10(*a*)). In a case where capacitive components are connected in series, a balance resistor 31 is required to prevent unbalance of the voltage. The number of components increases at a high voltage as described above, which results in a problem of increase in the board area.

In order to solve this problem, in the active filter device 8 of the present embodiment, the circuit board 20 has a configuration illustrated in FIG. 10(*b*). That is, since the circuit board 20 of the active filter device 8 according to the present embodiment includes the connector 32 to which the capacitor 13 is connected via the lead wire 33, it is possible to attach the capacitor 13 having high withstand voltage and a large capacity as a single unit externally to the circuit board 20 as illustrated in FIG. 10(*b*). Accordingly, it is unnecessary to provide, on the circuit board 20, a space for mounting a capacitor having a large volume, high withstand voltage, and a large capacity, or a plurality of capacitors and a balance resistor, and thus an area of the circuit board 20 can be reduced.

When the board is changed to be of low voltage specifications, it suffices to replace the capacitor 13 with a capacitor which accommodates low voltage specifications, and since it is merely replacement of the capacitor 13 connected to the connector 32, it is easy to accommodate low voltage specifications. This is only an example, and a configuration may be employed in which a circuit including a plurality of capacitive components and a balance resistor arranged therein is connected externally to the board.

The active filter device 8 according to each of the above embodiments is used as a harmonic current compensation device which suppresses a harmonic current generated by a power conversion device which converts alternating-current power into direct-current power. In particular, the active filter device 8 can be applied as a harmonic current compensation device which suppresses harmonic current generated from an inverter which operates a motor at variable speed. The active filter device 8 can be applied to general inverter products equipped with compressors such as air conditioners, freezers, heat pump-type water heaters, and showcases, which have various voltage specifications, and can be applied also to harmonic current compensation devices such as elevators, escalators, industrial inverters including inverters for driving conveyors in factories and the like, and inverters for industrial ventilators, which have wide voltage specifications.

As described above, the active filter device 8 according to each of the embodiments includes, as a circuit board on which circuit components of a circuit which generates a current for compensating for a harmonic current generated by a device which converts alternating-current power into direct-current power are mounted, a circuit board capable of mounting each circuit component which constitutes each of multiple circuits having different electrical characteristics. Consequently, it is possible to achieve a plurality of types of active filter devices having different electrical characteristics which can accommodate a plurality of types of power conversion devices having different source voltages, by using a common circuit board. Accordingly, it is possible to achieve a plurality of types of active filter devices having different electrical characteristics at low cost.

Third Embodiment

Figure 11:
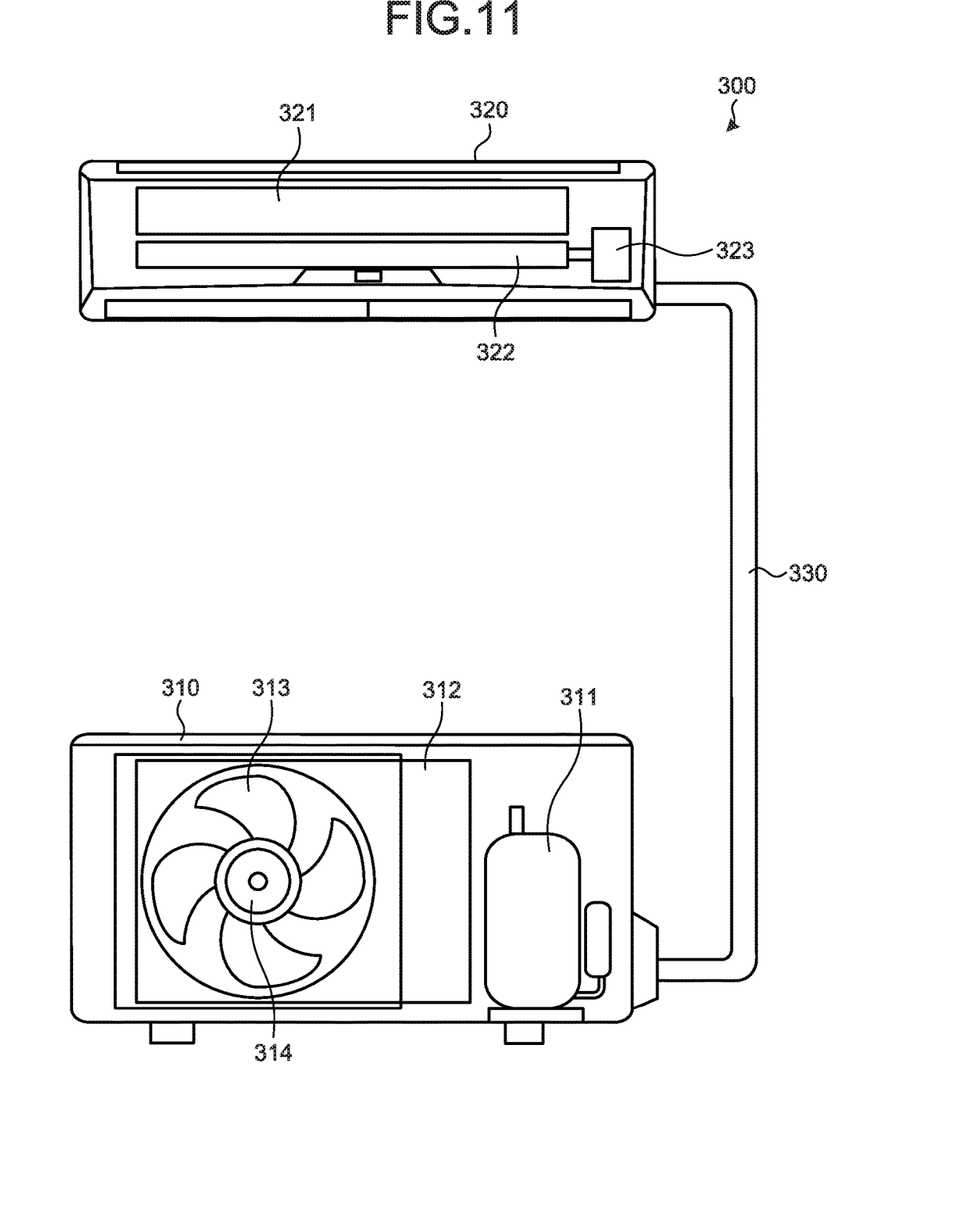
FIG. 11 is a view illustrating an example of an air conditioner which includes an active filter device.

FIG. 11 is a view schematically illustrating a configuration of an air conditioner 300 according to a third embodiment of the present invention. As illustrated in FIG. 11, the air conditioner 300 includes an outdoor unit 310, an indoor unit 320, and a refrigerant pipe 330 for circulating refrigerant between the outdoor unit 310 and the indoor unit 320.

The outdoor unit 310 includes a compressor 311, a heat exchanger 312, a fan 313, and a motor 314 which rotates the fan 313. The motor 314 and the fan 313 constitute a blower for flowing air to the heat exchanger 312. The indoor unit 320 includes a heat exchanger 321, a fan 322, and a motor 323 which rotates the fan 322. The motor 323 and the fan 322 constitute a blower for flowing air to the heat exchanger 321.

Although not illustrated in FIG. 11, at least one of the outdoor unit 310 and the indoor unit 320 includes a power conversion device and an active filter device. The power conversion device converts power supplied from an alternating-current source to generate power for driving at least one of the motor 314 and the motor 323. The active filter device compensates for a harmonic current generated by the power conversion device.

In the air conditioner 300 according to the third embodiment, the active filter device is constituted by the active filter device 8 according to the first or second embodiment. In the air conditioner 300 according to the third embodiment, it is possible to selectively perform either of a cooling operation for sending cold air from the indoor unit 320 or a heating operation for sending warm air from the indoor unit 320. The air conditioner 300 according to the third embodiment is the same as a conventional air conditioner except that the active filter device 8 according to the first or second embodiment is adopted as an active filter device which compensates for a harmonic current generated by a power conversion device which generates power for driving at least one of the motor 314 and the motor 323.

According to the air conditioner 300 of the third embodiment, in addition to the effects obtained by the active filter device 8 described in the first or second embodiment, effects of simplifying the configuration of the air conditioner 300 and reducing product cost can be obtained.

Air conditioners to which the present invention can be applied are not limited to an indoor air conditioner such as that illustrated in FIG. 11. The present invention can be applied to various types of devices including a motor, such as an air conditioner for a freezer warehouse and an air conditioner for a refrigerator.

In each of the embodiments, the case where the circuit board according to the present invention is the circuit board 20 of the active filter device has been described. However, this is merely an example, and the circuit board according to the present invention can be applied to a device to which a plurality of different source voltages can be applied.

The configuration described in the embodiments above indicates one example of the content of the present invention and can be combined with other known technology, and a part thereof can be omitted or modified without departing from the gist of the present invention.

The invention claimed is:

1. A circuit board that accommodates a plurality of different source voltages, wherein a plurality of printed wire wires that constitutes constitute a circuit is formed, either of a first circuit component used for a board that meets specifications for a first voltage or a second circuit component used for a board that meets specifications for a second voltage higher than the first voltage and having an external dimension different from an external dimension of the first circuit component, is mounted, a mounting unit for the first circuit component and a mounting unit for the second circuit component are provided to each of the plurality of printed wires, and spacing between the plurality of printed wires adjacent to each other is equal to or larger than a distance that secures an insulation distance when the second voltage is input, being a circuit board for an active filter device that compensates for a harmonic current generated by a device connected to an alternating-current source, and comprising a power conversion unit that generates a current having a phase opposite to the harmonic current, wherein a connector to which a capacitive component that smooths a bus voltage inside the power conversion unit is connected is mounted, and the capacitive component is externally connected.

2. The circuit board according to claim 1, wherein
the cross-sectional area of each of the plurality of printed wires is equal to or larger than a cross-sectional area that accepts a maximum current that is carried when the first voltage is input.

3. The circuit board according to claim 1, wherein
a first through hole into which a terminal of the first circuit component is inserted and a second through hole into which a terminal of the second circuit component is inserted are provided in each of the plurality of printed wires.

4. The circuit board according to claim 1, wherein
a part of each of the plurality of printed wires is divided,
when the first voltage is input, each of the divided plurality of printed wires are electrically connected by a jumper, and
when the second voltage is input, each of the divided plurality of printed wires are electrically connected by the second circuit component.

5. The circuit board according to claim 1, wherein
the power conversion unit includes switching elements formed of a wide bandgap semiconductor.

6. An active filter device comprising the circuit board according to claim 1, and
that compensates for a harmonic current generated by a device connected to an alternating-current source.

7. An air conditioner comprising a motor, and having the active filter device according to claim 6, the active filter device compensating for a harmonic current generated by a power conversion device that generates power for driving the motor.

8. An active filter device comprising the circuit board according to claim 1.

9. A circuit board used for a board that meets different voltage specifications, wherein a plurality of printed wire wires that constitutes constitute a circuit is formed, either of a first circuit component used for a board that meets specifications for a first voltage or a second circuit component used for a board that meets specifications for a second voltage higher than the first voltage and having an external dimension different from an external dimension of the first circuit component, is mounted, a mounting unit for the first circuit component and a mounting unit for the second circuit component are provided to each of the plurality of printed wires, and a cross-sectional area of each of the plurality of printed wire wires is equal to or larger than a cross-sectional area that accepts a maximum current that is carried when the first voltage is input, being a circuit board for an active filter device that compensates for a harmonic current generated by a device connected to an alternating-current source, and comprising a power conversion unit that generates a current having a phase opposite to the harmonic current, wherein a connector to which a capacitive component that smooths a bus voltage inside the power conversion unit is connected is mounted, and the capacitive component is externally connected.

10. The circuit board according to claim 9, wherein
a first through hole into which a terminal of the first circuit component is inserted and a second through hole into which a terminal of the second circuit component is inserted are provided in each of the plurality of printed wire.

11. The circuit board according to claim 9, wherein
a part of each of the plurality of printed wire is divided,
when the first voltage is input, each of the divided plurality of printed wires are electrically connected by a jumper, and
when the second voltage is input, each of the divided plurality of printed wires are electrically connected by the second circuit component.

12. The circuit board according to claim 9,
being a circuit board for an active filter device that compensates for a harmonic current generated by a device connected to an alternating-current source, and
comprising a power conversion unit that generates a current having a phase opposite to the harmonic current, wherein
a connector to which a capacitive component that smooths a bus voltage inside the power conversion unit is connected is mounted, and the capacitive component is externally connected.

13. The circuit board according to claim 12, wherein
the power conversion unit includes switching elements formed of a wide bandgap semiconductor.

14. An active filter device comprising the circuit board according to claim 12.

15. An active filter device comprising the circuit board according to claim 9, and
that compensates for a harmonic current generated by a device connected to an alternating-current source.

16. An air conditioner comprising a motor, and
having the active filter device according to claim 15, the active filter device compensating for a harmonic current generated by a power conversion device that generates power for driving the motor.

* * * * *